United States Patent [19]

Liou et al.

[11] Patent Number: 5,130,268
[45] Date of Patent: Jul. 14, 1992

[54] METHOD FOR FORMING PLANARIZED SHALLOW TRENCH ISOLATION IN AN INTEGRATED CIRCUIT AND A STRUCTURE FORMED THEREBY

[75] Inventors: Fu-Tai Liou, Carrollton; Fusen E. Chen, Dallas, both of Tex.

[73] Assignee: SGS-Thomson Microelectronics, Inc., Carrollton, Tex.

[21] Appl. No.: 681,080

[22] Filed: Apr. 5, 1991

[51] Int. Cl.⁵ .................... H01L 21/76; H01L 21/302
[52] U.S. Cl. ........................................ 437/67; 437/72; 437/89
[58] Field of Search ............................. 437/67, 72, 89

[56] References Cited
FOREIGN PATENT DOCUMENTS 0155698 9/1985 European Pat. Off. .............. 437/67
0258040 10/1985 Japan .

Primary Examiner—Brian E. Hearn
Assistant Examiner—Trung Dang
Attorney, Agent, or Firm—Rodney M. Anderson; Lisa K. Jorgenson; Richard K. Robinson

[57] ABSTRACT

A method for forming isolation structures in an integrated circuit, and the structures so formed, are disclosed. After definition of active regions of the surface is accomplished by provision of masking layers, recesses are etched into the exposed locations, to a depth on the order of the final thickness of the insulating isolation structure. Sidewall spacers of silicon dioxide, or another insulating amorphous material, are disposed along the sidewalls of the recesses, with silicon at the bottom of the recesses exposed. Selective epitaxial growth of silicon then forms a layer of silicon within the recesses, preferably to a thickness on the order of half of the depth of the recess. The epitaxial silicon is thermally oxidized, filling the recesses with thermal silicon dioxide, having a top surface which is substantially coplanar with the active regions of the surface. According to an alternative embodiment, the formation of the sidewall spacers may be done in such a manner that narrower recesses remain filled with the material of the sidewall spacers.

10 Claims, 4 Drawing Sheets

METHOD FOR FORMING PLANARIZED SHALLOW TRENCH ISOLATION IN AN INTEGRATED CIRCUIT AND A STRUCTURE FORMED THEREBY

This invention is in the field of integrated circuit fabrication, and is more particularly directed to electrical isolation of active regions at a surface of such integrated circuits.

BACKGROUND OF THE INVENTION

As is well known in the field of integrated circuit design, layout and fabrication, the manufacturing cost of a given integrated circuit is largely dependent upon the chip area required for the implementation of the desired function. Of course, the geometries and sizes of the active components such as the gate electrode in metal-oxide-semiconductor (MOS) technology, and as diffused regions such as MOS source and drain regions and bipolar emitters and base regions, are important factors in defining the chip area for a given integrated circuit. These geometries and sizes are often dependent upon the photolithographic resolution available for the particular manufacturing facility.

Another important factor in the chip area required for a given integrated circuit is the isolation technology, as sufficient electrical isolation must be provided between active circuit elements so that leakage therebetween does not cause functional or specification failure. The importance of isolation is particularly great for circuits such as static random access memories (SRAMs), particularly in recent years where maintenance of the stored data by extremely low levels of standby current has become highly desirable. Such low standby currents require excellent isolation, as the presence of leakage between active regions in the memory array will greatly increase the standby current drawn. The increasingly stringent standby current specifications, together with the demand for smaller memory cells in denser memory arrays, places significant pressure on the isolation technology in SRAM devices, as well as in other modern integrated circuits.

A well-known and widely-used isolation technique is the local oxidation of silicon, commonly referred to as LOCOS. In LOCOS, an oxidation barrier (generally silicon nitride) is placed over the locations of the surface of the chip into which the active devices are to be formed (i.e., the active regions). The wafer is then placed in an oxidizing environment, generally in steam at a high temperature such as 1100° C. The portions of the wafer surface not covered by the oxidation barrier oxidize to form thermal silicon dioxide thereat, with oxidation masked from the active regions by the oxidation barrier. LOCOS field oxide is generally formed to a sufficient thickness that a conductor placed thereover will not invert the channel thereunder, when biased to the maximum circuit voltage.

While LOCOS isolation is widely-used in the industry, it is subject to certain well-known limitations. A first significant limitation of LOCOS is encroachment of the oxide into the active regions, due to oxidation of silicon under the edges of the nitride mask. The expected distance of such encroachment must be considered in the layout of the integrated circuit; as such, the chip area is expanded as a result of the encroachment. Of course, the encroachment may be reduced by reducing the field oxide thickness, but at a cost of reduction of the threshold voltage of the parasitic field oxide transistor, and thus reduction of the isolation provided.

In addition, conventional LOCOS isolation adds topography to the integrated circuit surface. This is because the silicon dioxide must necessarily occupy a greater volume than that of the silicon prior to its oxidation, due to the reaction of the oxygen therewith. As a result, the surface of conventional LOCOS field oxide is above the surface of the active regions, with approximately half of the oxide thickness being above the active region surface. This topography requires overlying conductors to cover steps at the edges of the field oxide which, as is well known, presents the potential for problems in etching the conductor layer (i.e., the presence of filaments) and in the reliability of the conductor layer. In addition, the depth of field for submicron photolithography can be exceeded by the topography of the wafer surface.

A more recent isolation technique uses trenches etched into the surface of the wafer at the isolation locations, which are subsequently filled with a thermal or deposited oxide. Such trench isolation can provide extremely thick isolation oxides which extend into the wafer surface with little or no encroachment, and which can have an upper surface which is relatively coplanar with adjacent active regions. An example of such trench isolation is described in U.S. Pat. No. 4,958,213, where a relatively deep trench is etched and subsequently filled with both deposited oxide and thermal oxide. It should be noted, however, that the etching of deep trenches is a relatively expensive process, and one which is quite difficult to perform while maintaining close geometries. In addition, it is well known that thermally formed silicon dioxide generally has higher integrity than deposited silicon dioxide; the formation of thermal oxide in trenches, however, causes stress in the silicon, due to the volume expansion of silicon dioxide from that of the silicon prior to its oxidation. As a result, trench isolation tends to rely on deposited oxide to a large degree.

By way of further background, U.S. Pat. No. 4,842,675 describes a method of forming thermal LOCOS field oxide in combination with trenches. According to this method, recesses are etched into the surface of the wafer at the desired isolation locations. A conformal layer of silicon nitride is deposited thereover, followed by deposition of a thicker layer of silicon oxide. The deposited silicon oxide is etched back to expose the silicon nitride at the bottom of the wider isolation locations, but not within the narrower isolation locations. The exposed nitride is etched away, the deposited silicon oxide is removed, and the exposed single crystal portions of the wafer are thermally oxidized in conventional LOCOS fashion. The remainder of the volume of the isolation locations are filled with deposited oxide, after the formation of the thermal oxide. It should be noted, however, that the availability of silicon for such oxidation is limited to that at the bottom surface of the wider recess. In addition, the process appears to be quite complex.

It is therefore an object of this invention to provide a method of forming an isolation structure having a surface which is substantially coplanar with the surface of the adjacent active regions.

It is a further object of this invention to provide such a method which utilizes thermal silicon dioxide as the isolation material.

It is a further object of this invention to provide such a method which utilizes relatively shallow trenches in the surface of the wafer.

It is a further object of this invention to provide such a method which substantially fills the isolation recesses with thermal silicon dioxide.

It is a further object of this invention to provide such a method which can be used for both wide and narrow isolation locations.

Other objects and advantages of the invention will be apparent to those of ordinary skill in the art having reference to the following specification together with the drawings.

SUMMARY OF THE INVENTION

The invention may be incorporated into a method for forming isolation structures into relatively shallow recesses etched into a surface of an integrated circuit. After the formation of the recesses, sidewall filaments of insulating material, such as silicon dioxide, are formed into some or all of the recesses, exposing the bottom silicon portion thereof. Selective epitaxy then forms a silicon layer within the recesses from the bottom up, but not along the sides. The selective epitaxial layer is oxidized so that the recesses are substantially filled with thermal silicon dioxide. Both recesses with vertical sidewalls, formed by anisotropic etching of the silicon, or sloping sidewalls, formed by more isotropic silicon etching, may be utilized.

DETAILED DESCRIPTION OF THE PREFERRED EMBODIMENTS

Figure 1A:
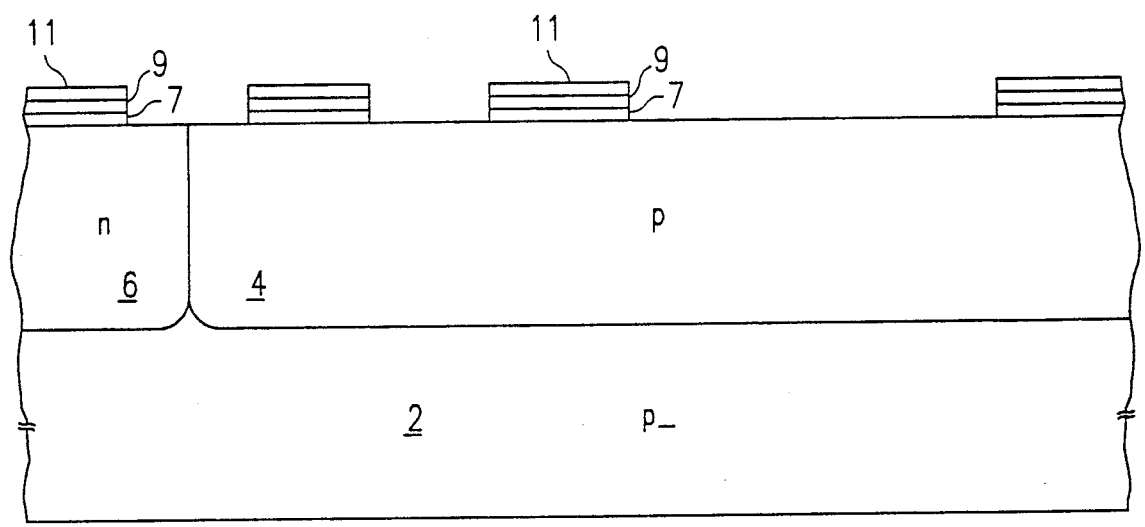
FIGS. 1a through 1f are cross-sectional views of an integrated circuit structure illustrating various steps in a method according to a first embodiment of the invention.

Referring now to FIGS. 1a through 1f, a first embodiment of the invention will now be described in detail. FIG. 1a illustrates a portion of a wafer, in cross-section, which has a surface at which isolation structures according to this embodiment of the invention are to be formed. As shown in FIG. 1a, a silicon substrate 2, lightly doped p-type in this example, has p-well 4 and n-well 6 formed at this surface, into which the active transistors of the integrated circuit will eventually be placed. P-well 4 and n-well 6 may be formed according to conventional well-known twin-well or twin-tub CMOS processes. It should be noted that the conductivity type and concentration illustrated in FIG. 1a for substrate 2 and wells 4, 6 is by way of example only, as the present invention is also applicable to single-well CMOS processes, and to other technologies including bipolar, n-channel and p-channel MOS, and BiCMOS technologies. Such technologies may have their active devices formed directly into a monolithic substrate (e.g., a lightly-doped p-type substrate), or into an epitaxial layer at the surface of a substrate. It is contemplated that the present invention is applicable to, and advantageous when implemented into, such other technologies.

In the example of FIG. 1a, wells 4 and 6 may be formed to a depth on the order of one to five microns, depending upon the desired well characteristics and process flow. As a result, the depths of wells 4 and 6 are shown in FIGS. 1a through 1f as illustrative only, and may or may not be to scale with the remainder of the structures formed at the surface. As shown in FIG. 1a, masking layers 7, 9, 11 are in place over those locations at which active devices are to be fabricated, and are absent from those locations at which isolation structures according to this embodiment of the invention will be formed. In this example, masking layer 7 is a thin layer of silicon dioxide, for example on the order of 13 nm thick, formed by thermal oxidation of silicon at the surface of wells 4 and 6. Masking layer 9 is a thin layer of polycrystalline silicon, for example on the order of 50 nm thick, deposited over oxide layer 7 by way of CVD. Masking layer 11 is preferably silicon nitride, on the order of 250 nm thick, deposited over polysilicon layer 9 by way of CVD. It should be noted that the relative thicknesses of masking layers 7, 9, and 11 are not illustrated to scale in the Figures, so that the presence of thin layers 7, 9 can be clearly shown. Masking layers 7, 9, 11 are removed from selected locations of the surface of wells 4, 6 by way of conventional photolithography and etch of such layers.

Masking layers 7, 9, 11 protect the active regions of wells 4, 6 from subsequent silicon etch and thermal oxidation. As such, the composition of masking layers 7, 9, 11 according to this embodiment of the invention may be similar to that used in masking portions of a silicon wafer from LOCOS thermal oxidation. It is contemplated that other configurations and composition of such a masking layer may alternatively be used according to the present invention, including single layers of material and other multiple layer systems.

As noted above, masking layers 7, 9, 11 are removed from those locations at which the isolation structures are to be formed. As shown in FIG. 1a, these locations may be within a single doped region, such as p-well 4, and may also be at boundaries between doped regions of opposite conductivity type, such as between p-well 4 and n-well 6, for isolation therebetween. As such, the isolation structures to be formed according to this embodiment of the invention can serve to electrically isolate transistors of the same conductivity-type in the same well, and can assist in the isolation of transistors of opposite conductivity type in adjacent wells.

Figure 1B:
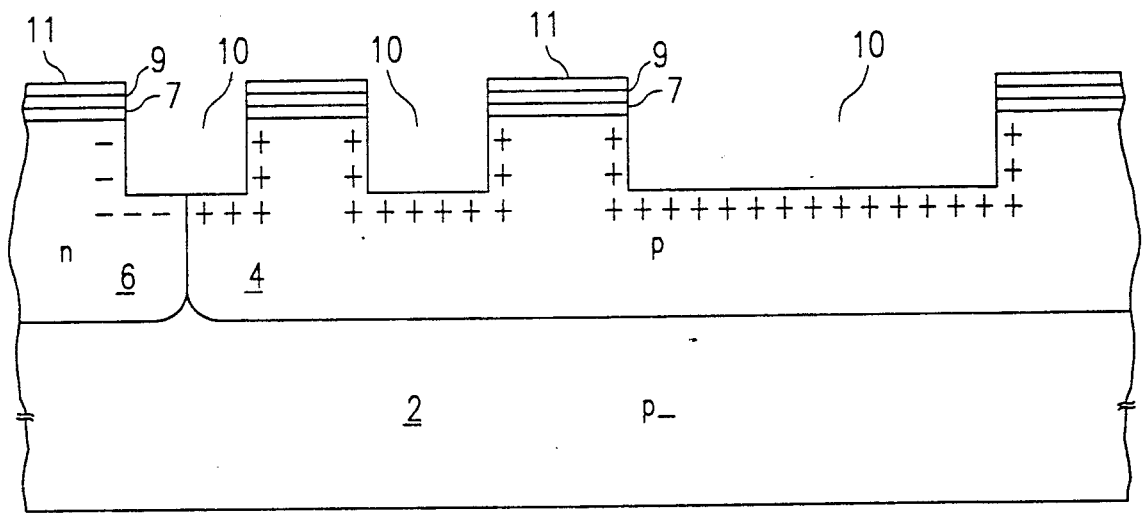

After definition of the active regions of wells 4, 6 at which masking layers 7, 9, 11 are disposed, the wafer is subjected to a silicon etch. According to this embodiment of the invention, the exposed locations of the surface of wells 4 and 6 are etched in substantially an anisotropic manner to form recesses 10, as shown in FIG. 1b. An example of such a relatively anisotropic etch is a plasma etch, with $SiCl_4$ and $SiF_4$, in combination, as the active species, under conventional plasma etch conditions which favor such anisotropy, as are well known. Recesses 10 according to this embodiment of the invention are relatively shallow, with their depth approximately the thickness of the thermal isolation oxide to be formed thereat. For example, recesses 10 according to this embodiment of the invention are on the order of one-third to one micron deep, preferably one-half micron. As a result, it is not essential or necessary that recesses 10 extend through wells 4, 6 to substrate 2.

Following the etch of recesses 10, the structure is subjected to one or more channel stop implants to assist the electrical isolation by increasing the parasitic threshold voltage, in the conventional manner. For conventional circuit configuration, where overlying conductors will be carrying voltages which are positive relative to the bias of p-well 4 and substrate 2, the channel stop implant into p-well 4 is preferably of a p-type dopant such as boron; an example of the dose and energy of a boron channel stop implant is 5E13 cm$^{-2}$ at an energy of 35 keV. The preferred channel stop implant into n-well 6 is of an n-type dopant, such as P$_{31}$ at a dose on the order of 2.8E12 cm$^{-2}$ at an energy of 60 keV. According to this embodiment of the invention, in which twin wells are used, additional masking of the two n-type and p-type channel stop implants is preferred, so that n-well 6 does not receive the p-type channel stop implant and vice versa. These channel stop implants will provide adequate doping of the portions of wells 4, 6 at which the isolation structures will be formed, without penetrating masking layers 7, 9, 11. As isolation is improved by also implanting the sides of recesses 10 with the channel stop, a rotating angle implant, as is well known in the art for the ion implantation of the sides of recesses and trenches, is preferred.

Figure 1C:
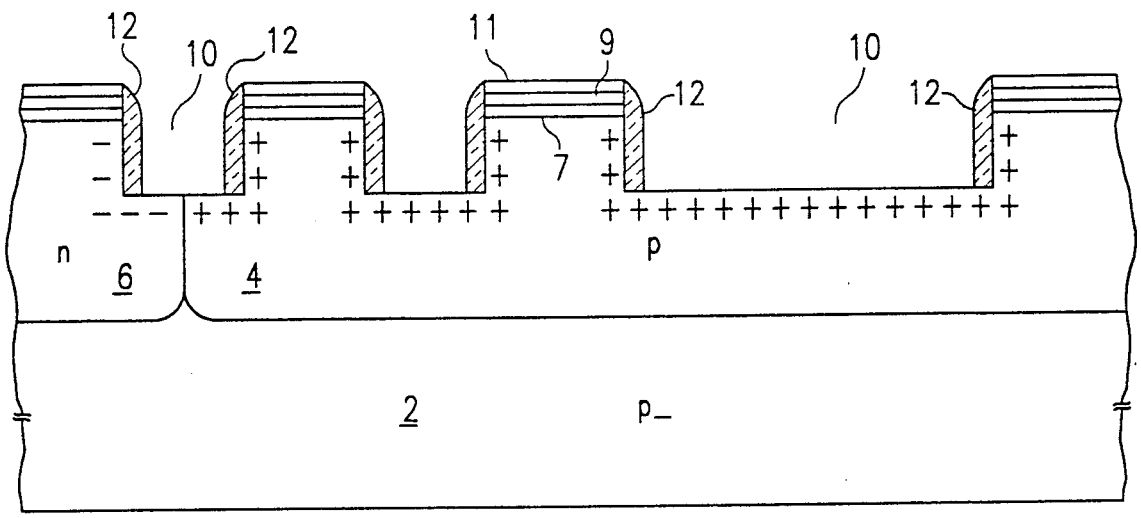
Figure 1D:
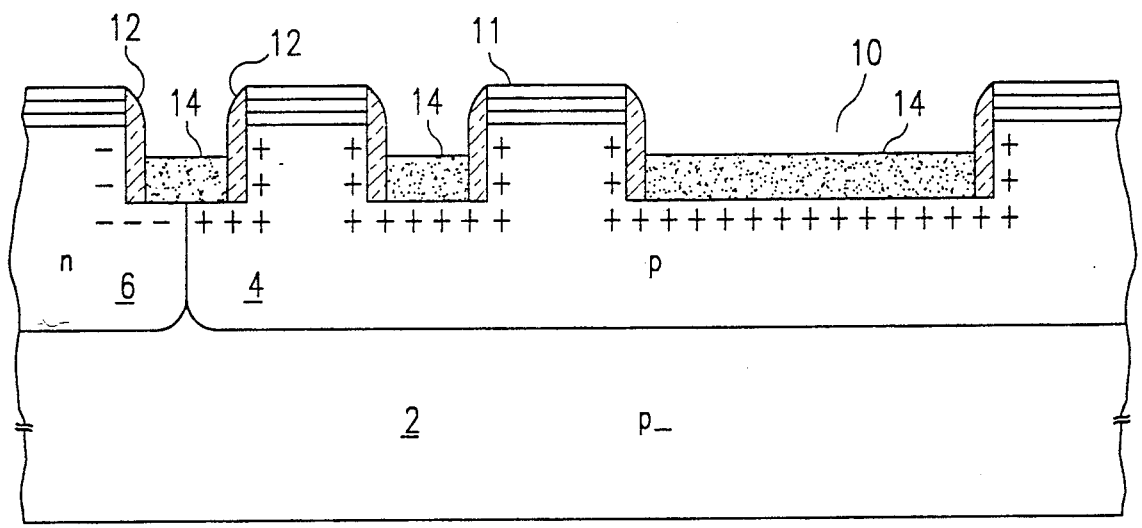

According to this embodiment of the invention, sidewall spacers 12 are formed on the sides of recesses 10, and consist of sufficiently amorphous material that epitaxial silicon will not deposit thereon. For purposes of thermal stress minimization, the preferred material for sidewall spacers 12 according to this embodiment of the invention is silicon dioxide, since the remainder of recesses 10 will be filled with silicon dioxide. Alternatively, sidewall spacers 12 may also be formed of silicon nitride, or of other dielectric materials having the property of inhibiting deposition of epitaxial silicon thereupon. Sidewall spacers 12 are formed on the sides of recesses 10 in the conventional manner for forming such spacers, namely by the deposition of a conformal layer of silicon dioxide, followed by an anisotropic etch to remove the portions of the conformal layer on flat surfaces and to leave sidewall spacers 12 on the sides of recesses 10, as shown in FIG. 1c.

Following the formation of sidewall spacers 12, silicon is deposited within recesses 10 by selective epitaxial growth. Selective epitaxial growth of silicon is a known method for the formation of single crystal silicon from exposed silicon, for example from the bottoms of recesses 10 of this embodiment of the invention, but not from materials lacking crystalline structure similar to silicon, such as silicon dioxide and silicon nitride. As a result, the subjecting of the structure of FIG. 1c to the process of selective silicon epitaxy will cause silicon layers 14 to form within recesses 10, with no silicon layers forming elsewhere, such as upon silicon nitride masking layer 11 or upon silicon dioxide sidewall spacers 12. The preferred conditions for selective epitaxial growth of silicon to form layers 14 according to this embodiment of the invention includes temperature in the range of 800° C. to 950° C., at a pressure of approximately 50 Torr. The silicon source gas may be silane (SiH$_4$) or dichlorosilane (SiCl$_2$H$_2$) gas introduced into the atmosphere of the wafer at these conditions.

The duration of the selective epitaxial growth is selected so that silicon layers 14 will fill approximately half the depth of recesses 10, not including masking layers 7, 9, 11. This thickness of silicon layers 14 is selected to account for the volume expansion of oxidized single crystal silicon, as the thickness of thermal silicon dioxide is approximately 2.17 times that of the silicon oxidized. By stopping the selective epitaxial growth at the proper depth below the top of recesses 10, the thickness of the thermal isolation oxide is maximized, while providing a top surface which is approximately coplanar with the surface of the active regions without requiring etchback. According to this example, with 0.5 μm recesses 10, selective epitaxial growth of silicon according to the above conditions for approximately four hours results in silicon layers 14 being on the order of 0.25 μm thick.

Figure 1E:
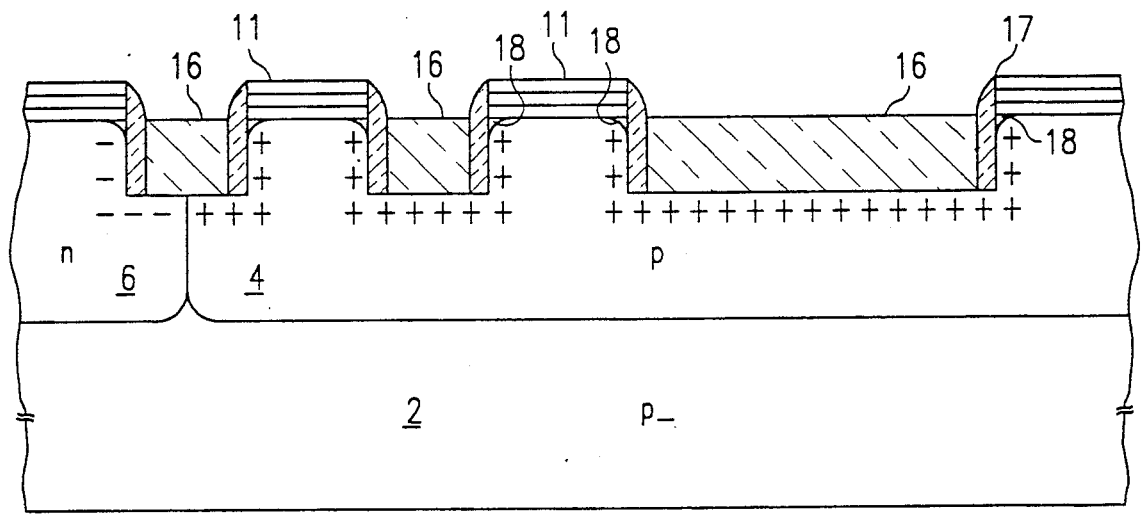

The formation of silicon layers 14 is then followed by their thermal oxidation. The preferred conditions for such oxidation is similar to that used in conventional LOCOS thermal oxidation, for example exposure of the wafer to steam at high temperature. Referring to FIG. 1e, the result of the oxidation operation is shown, with isolation oxide structures 16 substantially filling recesses 10. With the thickness of silicon layers 14 being on the order of one-half the depth of recesses 10, it is preferred that the oxidation be of such duration that recesses 10 are filled with the oxidized silicon layers 14, but not to excess. Excess oxidation beyond that required to fill recesses 10, for example where the bottom surface of recesses 10 would begin to oxidize, would raise the surface of oxide structures 16 above the surface of the adjacent active regions. In addition, such excess oxidation may also cause mechanical stress in wells 4, 6 adjacent to recesses 10, such mechanical stress in silicon being a known cause of junction leakage. For this example of the invention, with silicon layers 14 being on the order of 0.25 μm in recesses 10 of approximately 0.5 μm depth, the duration of the oxidation is on the order of four hours in steam at 950° C.

It should be noted that the thermal oxidation of silicon layers 14 in recesses 10 is performed with silicon nitride masking layer 11 in place over the surfaces at which active devices are to later be formed. The use of an oxidation barrier such as silicon nitride prevents the thermal oxidation of the underlying silicon in these locations. It should be noted, however, that oxygen may reach the corners of each of these active regions during this oxidation. This is due to the imperfect sealing at locations 17 of FIG. 1e at the edges of masking layer 11, adjacent to sidewall spacers 12. As a result, it is expected that some oxidation of the corners of the active regions will also occur, forming oxide filaments 18.

Oxide filaments 18 are not undesirable, however, as they provide certain advantages in the isolation scheme according to this embodiment of the invention. When portions of the active regions in wells 4, 6 are biased in normal operation, the maximum electric field of the drain of the parasitic transistors (i.e., those where oxide structures 16 serve as the "gate" dielectric) will be at a surface location adjacent to an oxide structure 16. It is well known that the electric field will locally concentrate at sharp corners of biased regions, and that it is the maximum local electric field that causes junction breakdown and field leakage. According to this embodiment of the invention, the rounding of the corners of the active regions due to oxide filaments 18 will reduce the local electric field thereat when biased, and will further reduce the leakage tendency of the parasitic field oxide transistor.

Figure 1F:
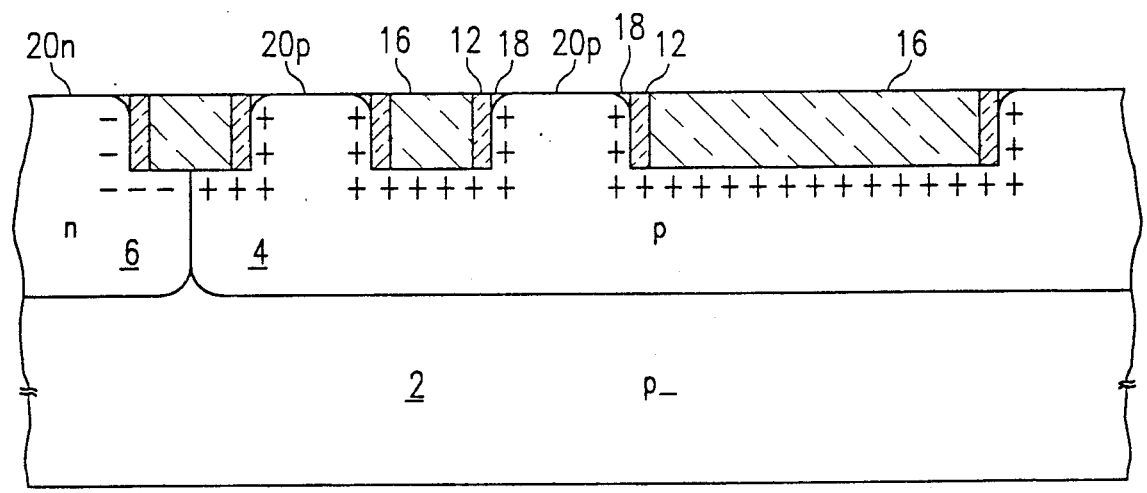

After the formation of thermal silicon dioxide structures 16, masking layers 7, 9, 11 are removed from the surface of wells 4, 6 thereat, exposing active surfaces 20n and 20p as shown in FIG. 1f. Transistors may then be formed into or near active surfaces 20n and 20p in the conventional manner, with each active surface being electrically isolated from others by oxide structures 16, Conductive polysilicon or metal electrodes may be formed over oxide structures 16, for carrying up to the maximum circuit voltage without inverting the portion of well 4 under oxide structures 16 and turning on the parasitic field oxide transistor.

As is evident from FIG. 1f, the isolation method and structures 16 according to this embodiment of the invention provide for significant advantages over those in the prior art. Firstly, the upper surface of oxide structures 16 are substantially coplanar with active surfaces 20n and 20p. As a result, conductors such as metal or polysilicon can make connection between active elements thereover, without having to make steps over topography caused by the isolation oxide. As noted above, planarized wafer surfaces provide best results for high resolution photolithography by maintaining the focused surface within the depth of field of the photolithography equipment. In addition, such planarization serves to eliminate problems such as post-etch conductive filaments and step coverage faults. Secondly, oxide structures 16 are formed substantially of thermal oxide (i.e., with the exception of sidewall spacers 12) according to this embodiment of the invention. Thermal oxide has higher integrity, and thus fewer defects and less dielectric leakage, than similarly sized deposited silicon dioxide as used in other isolation schemes utilizing recesses and trenches. This construction of isolation structures 16 is achieved according to this embodiment of the invention without significant encroachment into the active regions, with only the favorable rounding of the corners of the active regions expected.

In addition, recesses 10 are relatively shallow according to this first embodiment of the invention, and as such are relatively easily etched without requiring high levels of anisotropy, high etch rates, or expensive etch equipment. Referring now to FIGS. 2a through 2f, an alternative embodiment of the invention will now be described which allows the use of silicon etching of even less anisotropy than that of the first embodiment, further reducing manufacturing costs.

Figure 2A:
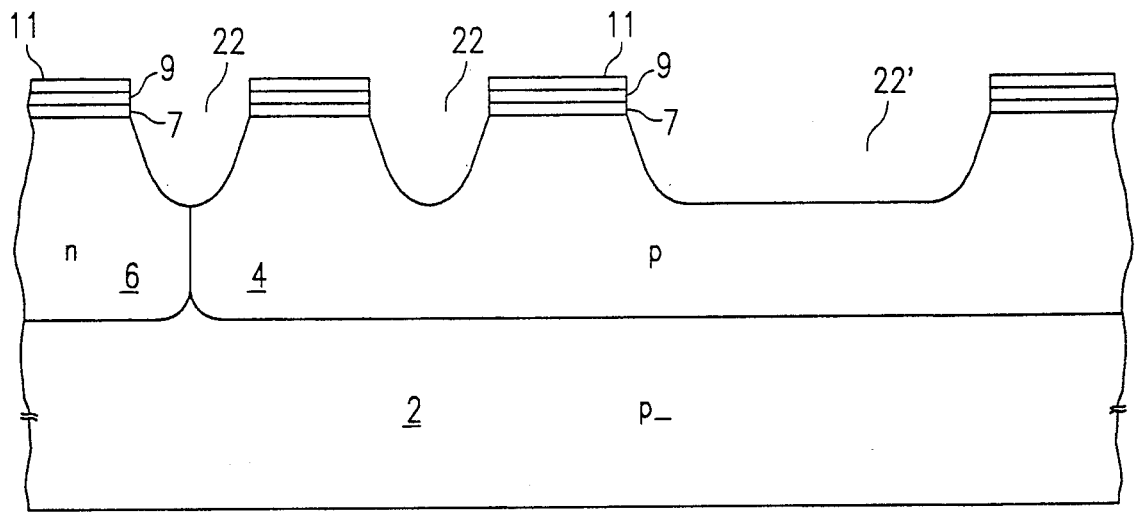
FIGS. 2a through 2f are cross-sectional views of an integrated circuit structure illustrating various steps in a method according to a second embodiment of the invention.

This second embodiment of the invention utilizes similar masking layers 7, 9, 11 for protecting and defining the active surfaces of wells 4, 6 over substrate 2, as described hereinabove relative to FIG. 1a. The structure is subjected to a relatively isotropic silicon etch, such as a wet etch using KOH as the etchant, or a plasma etch using $SiCl_4$ and $SiF_4$, in combination, as the active species under well-known plasma etch conditions which favor more isotropic etching than in the embodiment described hereinabove. It should be noted that numerous alternative techniques for the contoured plasma etching of silicon are well-known and may be used in this embodiment of the invention, including such techniques as photoresist erosion. The etch is stopped when the desired depth is reached, corresponding to the desired thickness of the isolation oxide as in the embodiment described hereinabove. It is also important that the etch be stopped prior to such time as masking layers 7, 9, 11 become undercut to any significant extent. According to this embodiment of the invention, both relatively narrow recesses 22, for example having a width on the order of their depth (e.g., 0.5 $\mu$m to 1.0 $\mu$m), and also relatively wide recesses 22', are formed. As will be evident from the description hereinbelow, narrow recesses 22 and wide recesses 22' will be filled in different ways. Recesses 22 and 22' so formed are shown in FIG. 2a.

Figure 2B:
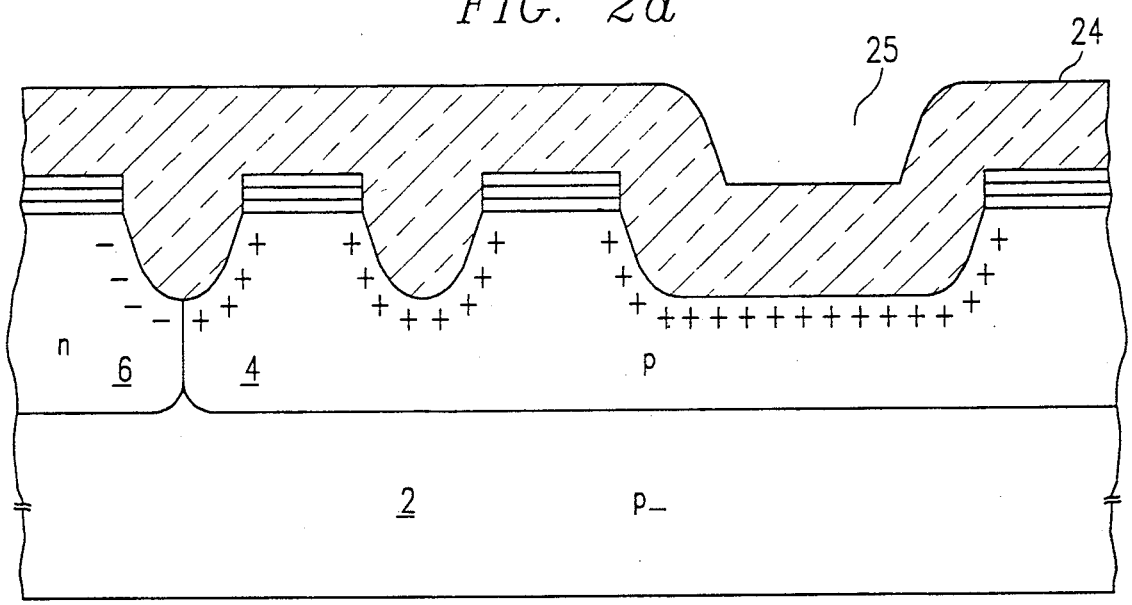

After definition of recesses 22 and 22', a channel stop implant is performed thereinto, similarly as described hereinabove, and in such a manner that masking layers 7, 9, 11 mask the active regions from receiving the same. Preferably a rotating angle implant is performed so that the sides of recesses 22 and 22' also receive the channel stop implant. Following channel stop implant, a layer 24 of a relatively amorphous insulating material, such as silicon dioxide, is deposited in conformal fashion thereover by way of CVD, resulting in the structure shown in FIG. 2b. The preferred method for depositing oxide layer 24 is by the well-known technique of decomposition of tetraethyloxysilane (TEOS). The thickness of oxide layer 24 preferably fills narrower recesses 22 so as to have a planarized surface thereover, while filling wider recesses 22' in a conformal manner, dipping into recess 22' so as to have depression 25 at its surface as shown in FIG. 2b. In this example, where recesses 22 have a maximum depth of approximately 0.5 $\mu$m, the thickness of oxide layer 24 is approximately one to three microns. For this thickness of oxide layer 24, wider recesses 22' must be at least approximately five microns wide for such a depression 25 to form therein. As will be noted hereinbelow, the presence or absence of depression 25 within a particular recess 22 will determine whether or not thermal oxide will be formed therewithin.

Figure 2C:
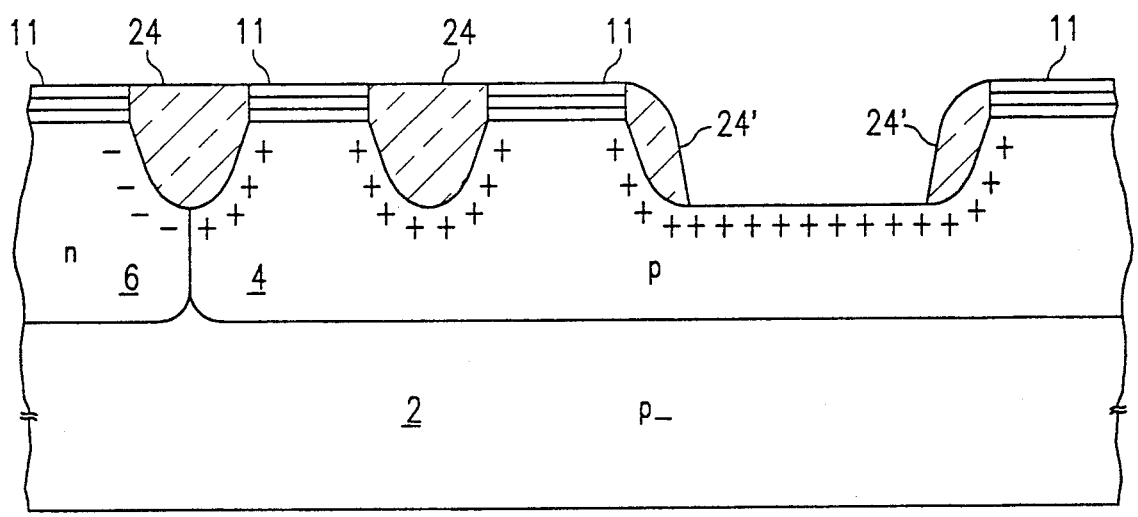

Following deposition of oxide layer 24, an anisotropic etchback is performed to clear a location at the bottom of wider recess 22'. This etch, for example a plasma etch using $CF_4$ and $CHF_3$, in combination, as the active species, preferably also clears the surface of masking layer 11 as shown in FIG. 2c, since the thickness of oxide layer 24 thereover is the approximately the same as its thickness over the bottom portion of wider recess 22' in depression 25. Also as a result of this etch, sidewall filaments 24' are left on the sides of wider recess 22', due to the anisotropic nature of the oxide etch. Since the thickness of oxide layer 24 over narrower recesses 22 was substantially the same as that over masking layer 11 and the bottom of wider recess 22', narrower recesses 22 remain filled with oxide 24. This oxide 24 will serve as the isolation oxide in these locations.

Figure 2D:
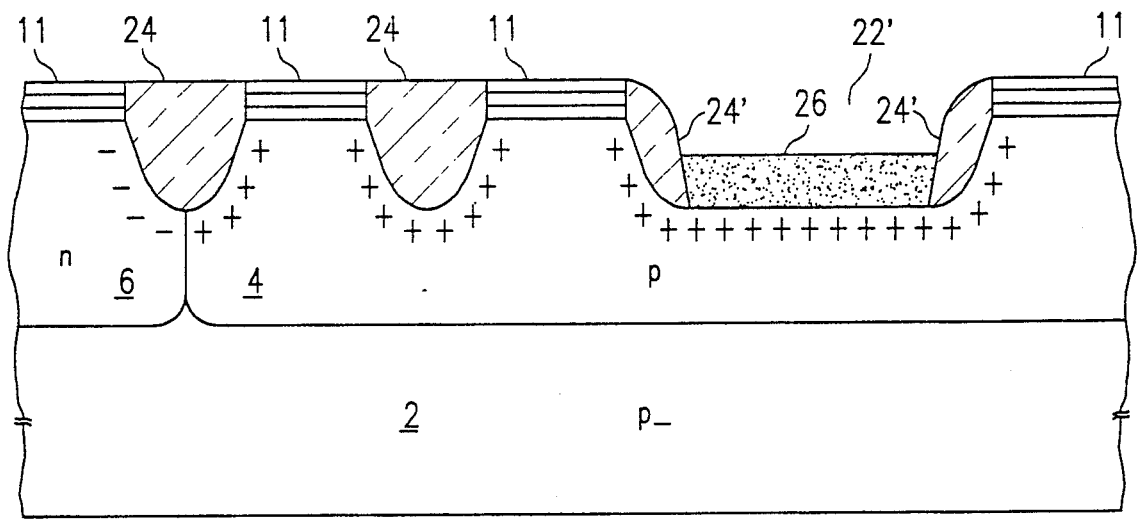

Referring now to FIG. 2d, the structure is shown after the selective epitaxial growth of silicon layer 26 from the bottom of wider recess 22', according to the process conditions for such epitaxy described hereinabove relative to the first embodiment. As in the prior embodiment, silicon layer 26 forms only on exposed silicon, and not on masking layer 11, oxide 24, or on oxide filaments 24' on the sidewalls of wider recess 22'. As in the prior embodiment, the thickness of silicon layer 26 is preferably approximately half the depth of recess 22', so that thermal oxidation thereof can substantially fill the recess without requiring a planarization etchback, and without significant mechanical stress.

Figure 2E:
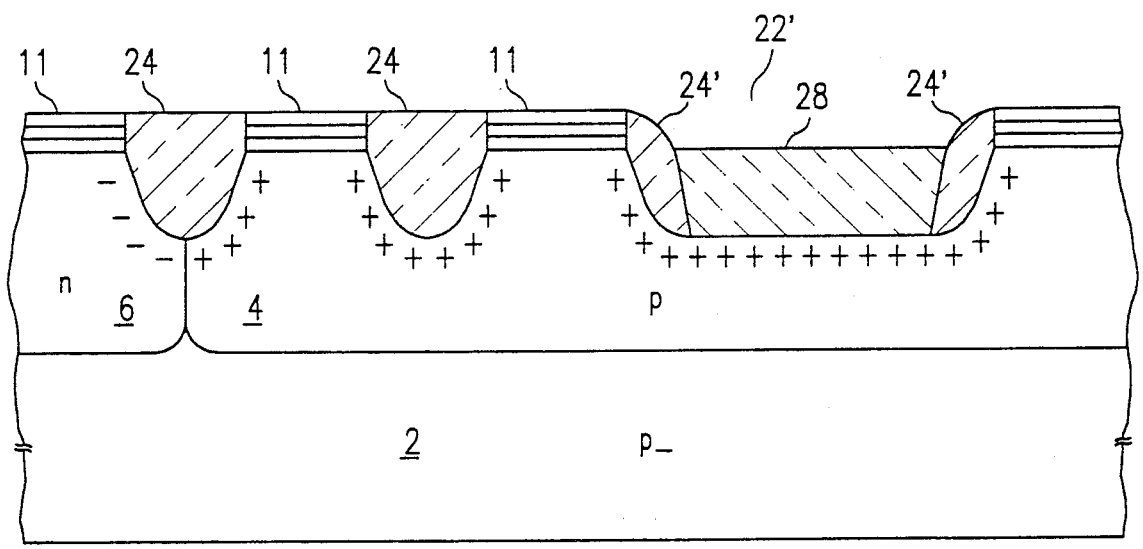
Figure 2F:
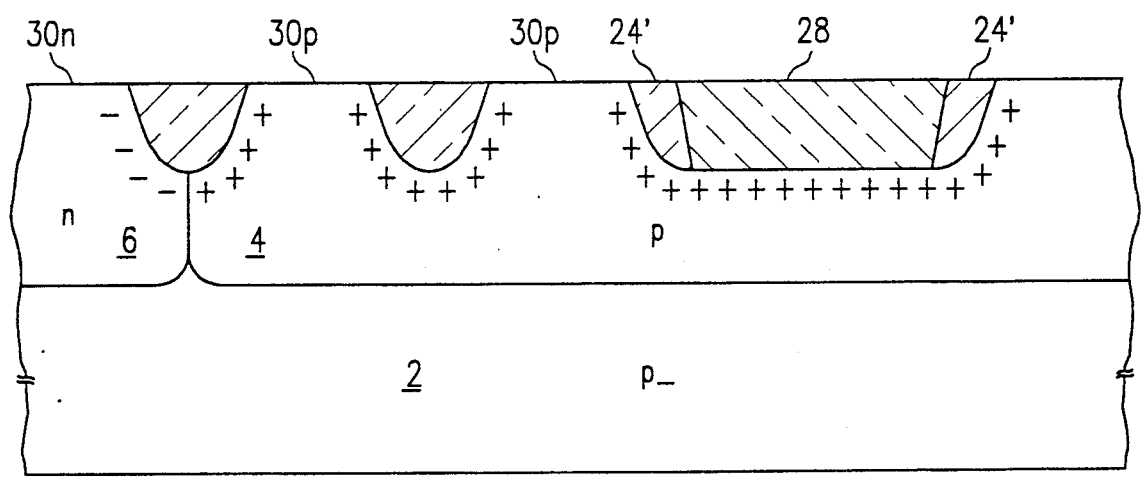

Referring now to FIG. 2e, the structure is illustrated after the thermal oxidation of silicon layer 26, to form thermal oxide layer 28 in wider recess 22', preferably according to the same steam oxidation conditions described hereinabove for the first embodiment of the invention. Since the thickness of silicon layer 26 was approximately half the depth of recess 22', the top surface of thermal oxide 28 will be approximately coplanar with the surface of wells 4, 6 under masking layer 7. While not shown, additional rounding of the corners of the active regions may also occur from this oxidation, similarly as in the first embodiment described hereinabove. Masking layers 7, 9, 11, as well as oxide layer 24 in narrower recesses 22 and oxide sidewall spacers 24' in wider recess 22', are then etched back to expose active surfaces 30n and 20p, as shown in FIG. 2f.

As in the first embodiment described herein, active devices such as transistors may be formed into or near active surfaces 30p and 30n of wells 4 and 6, respectively. The topography over isolation oxide structures 24 and 26 is relatively benign, as their surfaces are substantially coplanar with active surfaces 30p and 30n. According to this embodiment of the invention, wider recesses 22' are substantially filled with high integrity thermal oxide 28. The process performed according to this embodiment of the invention is contemplated to be even more cost-effective than the first embodiment of the invention, due to the lesser constraints and requirements for the silicon etch of recesses 22. It should be noted that this cost reduction is achieved in exchange for the use of deposited TEOS oxide in the narrower recesses 22.

While the invention has been described herein relative to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. A method of forming an isolation structure at a semiconducting surface of a body, comprising:
    forming a masking layer over selected locations of said surface corresponding to active regions, said masking layer comprising an oxidation barrier material;
    etching a recess into said surface at a location not covered by said masking layer;
    forming sidewall spacers consisting essentially of silicon dioxide along the sides of said recess, in such a manner that semiconducting material is exposed at the bottom of said recess;
    selectively depositing silicon at the exposed bottom of said recess, in such a manner that said silicon is not deposited along said sidewall spacers; and
    oxidizing said deposited silicon; wherein said oxidizing step also oxidizes corner locations of said active regions adjacent to said recess.

2. The method of claim 1, wherein said masking layer comprises silicon nitride.

3. The method of claim 1, wherein said step of forming sidewall spacers comprises:
    depositing a conformal layer of silicon dioxide overall; and
    anisotropically etching said layer of silicon dioxide to form said sidewall spacers.

4. The method of claim 1, wherein said step of selective depositing silicon comprises selective epitaxial growth of silicon.

5. The method of claim 4, wherein the thickness of said deposited silicon in said recess is approximately half of the depth of said recess.

6. The method of claim 1, wherein the thickness of said deposited silicon in said recess is approximately half of the depth of said recess.

7. The method of claim 1, wherein said step of etching a recess is substantially anisotropic.

8. The method of claim 1, wherein said step of etching a recess etches first and second recesses at first and second locations of said surface, said first recess being wider than said second recess.

9. The method of claim 8, wherein said step of forming sidewall spacers comprises:
    depositing a conformal layer of silicon dioxide overall; and
    anisotropically etching said layer of silicon dioxide to form said sidewall spacers in said first recess;
    and wherein the thickness of said layer of silicon dioxide is such that said second recess remains filled therewith after said anisotropically etching step.

10. The method of claim 9, wherein said step of depositing silicon comprises selective epitaxial growth of silicon;
    and wherein the thickness of said deposited silicon in said recess is approximately half of the depth of said first recess.

* * * * *